United States Patent
Chang

(10) Patent No.: US 8,647,898 B2
(45) Date of Patent: Feb. 11, 2014

(54) LED DEVICE AND METHOD FOR MANUFACTURING THE SAME

(75) Inventor: Chao-Hsiung Chang, Hsinchu (TW)

(73) Assignee: Advanced Optoelectronics Technology, Inc., Hsinchu Hsien (TW)

(*) Notice: Subject to any disclaimer, the term of this patent is extended or adjusted under 35 U.S.C. 154(b) by 123 days.

(21) Appl. No.: 13/339,198

(22) Filed: Dec. 28, 2011

(65) Prior Publication Data

US 2012/0305961 A1 Dec. 6, 2012

(30) Foreign Application Priority Data

Jun. 2, 2011 (CN) .......................... 2011 1 0147464

(51) Int. Cl.
*H01L 21/00* (2006.01)

(52) U.S. Cl.
USPC ............... 438/26; 257/E33.068; 257/E33.061

(58) Field of Classification Search
USPC ......... 257/E33.068, E33.061; 438/26, 27, 28, 438/29
See application file for complete search history.

(56) References Cited

U.S. PATENT DOCUMENTS

| 5,500,869 A * | 3/1996 | Yoshida et al. ............ 372/50.23 |
| 7,892,868 B2 * | 2/2011 | Chen et al. ...................... 438/26 |
| 8,546,838 B2 | 10/2013 | Kim et al. |
| 2011/0002140 A1 | 1/2011 | Tsukahara et al. |
| 2011/0037079 A1 * | 2/2011 | Lee ................................. 257/88 |

FOREIGN PATENT DOCUMENTS

| EP | 1936704 A2 | 6/2008 |
| TW | 200727507 A | 7/2007 |
| TW | M383202 | 6/2010 |
| TW | 201105767 A1 | 2/2011 |

* cited by examiner

*Primary Examiner* — Matthew Reames
(74) *Attorney, Agent, or Firm* — Altis Law Group, Inc.

(57) ABSTRACT

An LED device comprises a substrate, an LED chip and a luminescent conversion layer. The substrate comprises a first electrode, a second electrode and a reflector located on top faces of the first and the second electrodes. The LED chip is disposed on the first electrode and electrically connected to the first and the second electrodes. The luminescent conversion layer is located inside the reflector and comprises a first luminescent conversion layer and a second luminescent conversion layer with different specific gravities. A manufacturing method for the LED device is also provided.

9 Claims, 6 Drawing Sheets

# LED DEVICE AND METHOD FOR MANUFACTURING THE SAME

TECHNICAL FIELD

The disclosure relates generally to semiconductor devices, and more particularly to a light emitting device having high efficiency and uniform color temperature.

DESCRIPTION OF THE RELATED ART

Light emitting diodes (LEDs) have low power consumption, high efficiency, quick reaction time, long life and the absence of toxic elements such as mercury in their manufacture. In an LED package, an intensity of light emitted directly out in a plan view of an LED chip, the positive light, is greater than that of lateral-direction light which results in non-uniform illumination by the LED package. Moreover, a plurality of luminescent conversion elements evenly distributed around the LED chip may be excited by light emitted from the LED chip to produce light beams of shifted and different wavelengths. Therefore, the LED package may cause the issues of non-uniform illumination deviation of color temperature and dispersed chromaticity. A new LED device having high efficiency and uniform color temperature is required.

DETAILED DESCRIPTION

Exemplary embodiments of the disclosure will be described with reference to the accompanying drawings.

Figure 1:
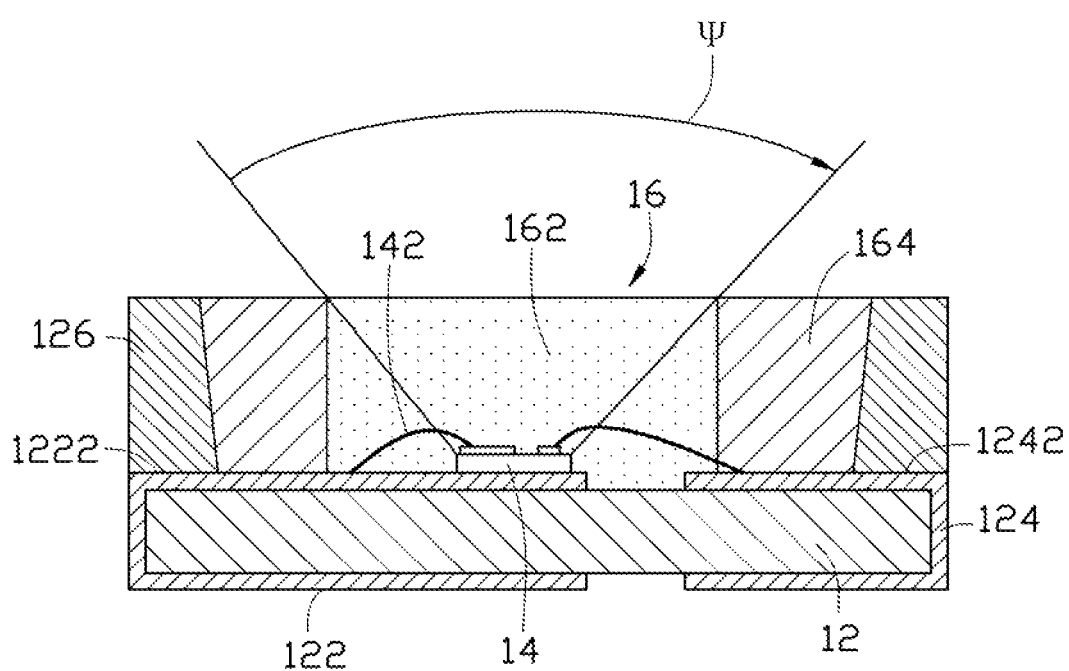
FIG. 1 is a cross section of an LED device of the disclosure.

Referring to FIG. 1, the disclosure provides an LED device 10 comprising a substrate 12, an LED chip 14 and a luminescent conversion layer 16.

The substrate 12 comprises a first electrode 122, a second electrode 124 and a reflector 126. The first and the second electrode 122, 124 are opposite to each other, and respectively incorporate top faces 1222, 1242 above the substrate 12. The reflector 126 is located on the top faces 1222, 1242 and can be formed out of polymer, polyphthalamide (PPA) or plastic.

Figure 3:
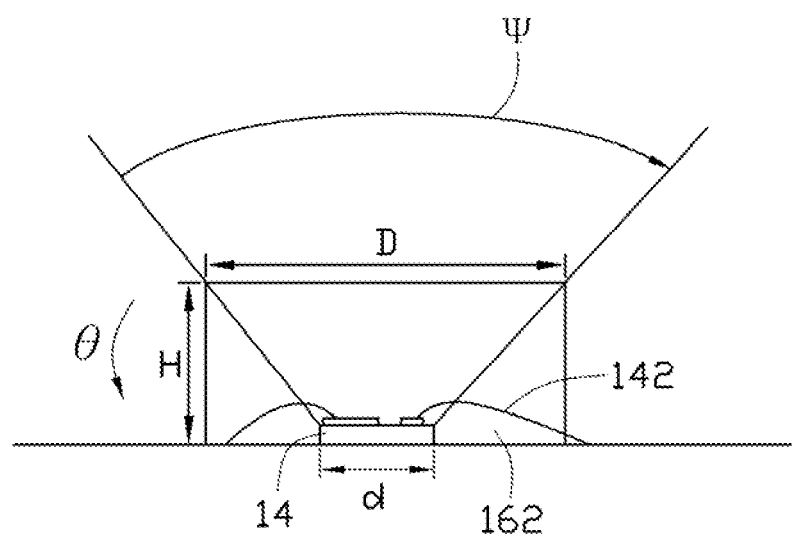
FIG. 3 is a cross section of a first illuminating conversion layer of the LED device of FIG. 1.

The LED chip 14 is disposed on the top face 1222 of the first electrode 122 surrounded by the reflector 126 and electrically connects to the first and the second electrodes 122, 124. In the disclosure, the LED chip 14 is connected to the first and the second electrode 122, 124 via conductive wires 142; alternatively, the LED chip 14 can be electrically connected to the electrodes 122, 124 by flip chip bonding or eutectic bonding (not shown). Moreover, as shown in FIGS. 1 and 3, the LED chip 14 is an irradiative light emitting component, which comprises an angle ψ of positive light, an angle θ of lateral light and a width d, wherein the intensity of the positive light is about 8 to 12 times that of the lateral light. In this embodiment, ψ is between 100 to 130 degrees. Furthermore, the ψ and the θ meet the following condition:

$$\theta = \frac{(180 - \psi)}{2}$$

Figure 2:
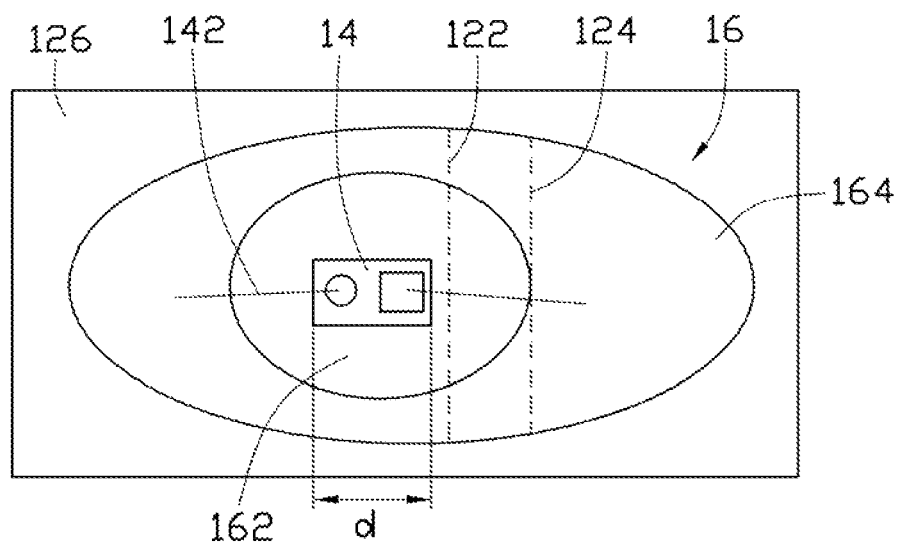
FIG. 2 is a top view of the LED device of FIG. 1.

Referring to FIGS. 1 and 2, the luminescent conversion layer 16 comprises a first luminescent conversion layer 162 and a second luminescent conversion layer 164 of different specific gravities, wherein the first luminescent conversion layer 162 corresponds to the positive light of the LED chip 14 within the angle ψ and the second luminescent conversion layer 164 surrounds the first luminescent conversion layer 162. In one embodiment as shown in FIG. 3, the first luminescent conversion layer 162 is a cylinder covering the LED chip 14, where the cylinder has a diameter D and a depth H. The depth H of the cylinder is substantially equal to a thickness of the reflector 126. The first luminescent conversion layer 162 satisfies the flowing condition:

$$D = [2 \times (\tan \theta \cdot H) + d]$$

The positive light of the LED chip 14 is covered by the first luminescent conversion layer 162 within the angle ψ; therefore the positive light of the LED chip 14 may be enough in terms of excitation to activate the luminescent conversion elements (not shown) inside the first luminescent conversion layer 162. Furthermore, the lateral light of the LED chip 14 passes through the second luminescent conversion layer 164 within the angle θ. In this embodiment, the specific gravity of the first luminescent layer 162 is greater than that of the second luminescent layer 164 such that there is a greater density of luminescent conversion elements inside the first luminescent conversion layer 162 than there is inside the second luminescent conversion layer 164. Accordingly, the lateral light which excites the lower specific gravity of the second luminescent layer 164 and then exits from the luminescent conversion layer 16 may be enhanced to rival or be identical to the positive light to result in an LED device 10 having uniform illumination, stable color temperature and better-defined chromaticity.

Figure 4:
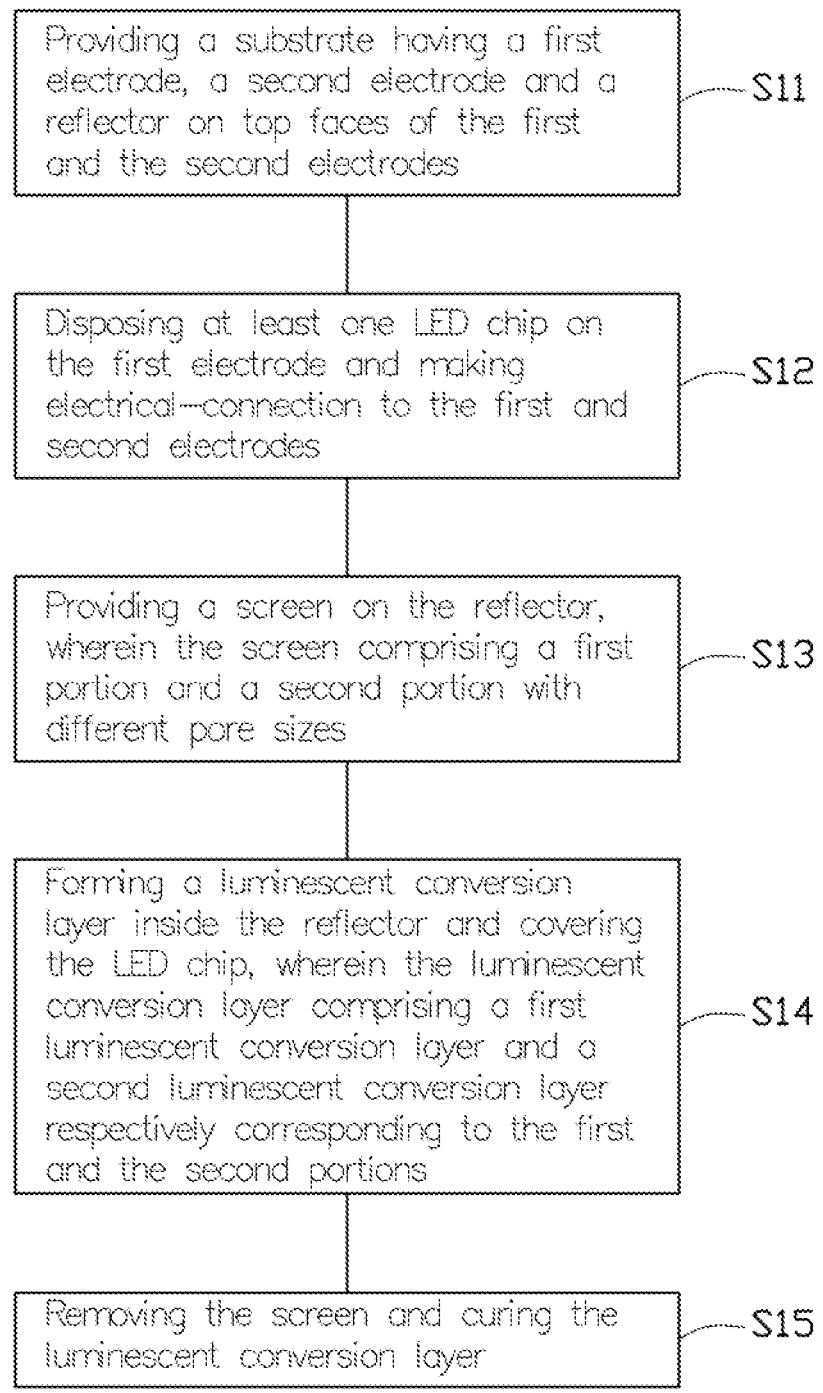
FIG. 4 is a flow chart of a manufacturing method for the LED device of FIG. 1.
Figure 5:
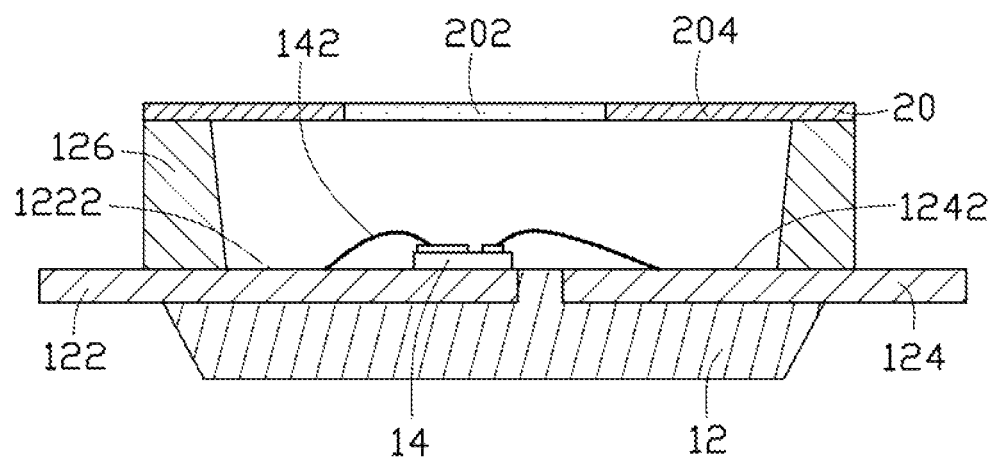
FIG. 5 is a schematic diagram showing a step of providing a screen on a reflector included in the manufacturing method for the LED device of FIG. 4.

Referring to FIG. 4. the disclosure also provides a manufacturing method for the LED device 10, which comprises the following steps:

In step S11, a substrate is provided. As shown in FIG. 5, the substrate 12 comprises a first electrode 122, a second electrode 124 and a reflector 126 located on the top faces of the first and second electrodes 122, 124. In this embodiment, the reflector 126 is formed by molding. Alternatively, the reflector 126 and the substrate 12 can be manufactured integrally as a monolithic piece and be made of the same material.

In step S12, an LED chip 14 is disposed on the first electrode 122 and electrically connected to the first and the second electrodes 122, 124. In this embodiment, the LED chip 14 makes connections to the first and the second electrodes 122, 124 by means of conductive wires 142.

In step S13, a screen 20 is located on the reflector 126. The screen 20 comprises a first portion 202 and a second portion 204, wherein each of the meshes of the first portion 202 is larger than that of the second portion 204. The first portion 202 corresponds to the LED chip 14 and is surrounded by the second portion 204. In this embodiment, the first portion 202 is a circle located on a center of the screen 20, and comprises a diameter E which substantially equal to the diameter D of the first luminescent conversion layer 162. Similarly, the first portion 202 of the screen 20 satisfies the flowing condition:

$$E = [2 \times (\tan \theta \cdot H) + d]$$

$$\theta = \frac{(180 - \psi)}{2}$$

wherein ψ is an angle of the positive light of the LED chip 14, θ is an angle of the lateral light emitted by the LED chip 14, d is a width of the LED chip 14 and H is a depth of the reflector 126.

Figure 6:
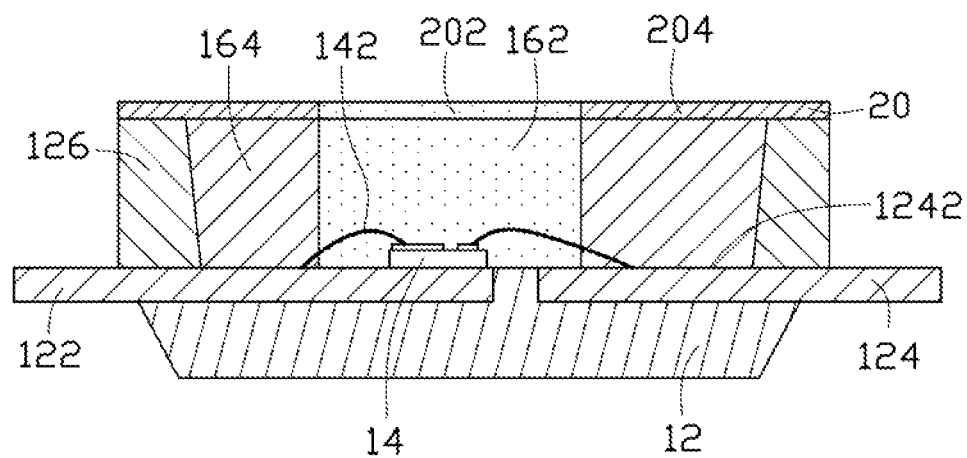
FIG. 6 is a schematic diagram showing a step of forming an illuminate conversion layer included in the manufacturing method for the LED device of FIG. 4.

In step S14, a luminescent conversion layer 16 inside the reflector 126 and covering the LED chip 14 is formed. As shown in FIG. 6, the luminescent conversion layer 16 comprises a first luminescent conversion layer 162 corresponding to the first portion 202 of the screen 20 and a second luminescent conversion layer 164 corresponding to the second portion 204 of the screen 20. The second luminescent conversion layer 164 surrounds the first luminescent conversion layer 162. The first luminescent conversion layer 162 is formed by a sifting of a liquid encapsulant (made of silicon or resin) having luminescent conversion elements therein into the reflector 126 through the first portion 202, whereby the particle sizes of the luminescent conversion elements (not shown) inside the first luminescent conversion layer 162 are consistent. Similarly, the second luminescent conversion layer is formed by a sifting of the liquid encapsulant (made of silicon or resin) having the luminescent conversion elements therein into the reflector 126 through the second portion 204, whereby the particle sizes of the luminescent conversion elements (not shown) inside the second luminescent conversion layer 164 are also consistent. Since each of the meshes of the first portion 202 is larger than that of the second portion 204, the quantity of luminescent conversion elements inside the first luminescent conversion layer 162 is also larger than that in the second luminescent conversion layer 164. Hence, a specific gravity of the first luminescent conversion layer 162 is greater than that of the second luminescent conversion layer 164.

In step S15, the screen 20 is removed and the luminescent conversion layer 16 is cured.

The disclosure provides an LED device having multiple luminescent conversion layers, wherein the specific gravity of the first luminescent layer is greater than that of the second luminescent layer. Moreover, by virtue of the lateral light exciting the luminescent conversion elements which are at a lower specific gravity in the second luminescent layer, the intensity of any lateral light emitted from the luminescent conversion layer is enhanced to rival or be identical to the positive light emitted. Therefore, the LED device of the present disclosure has uniform illumination, stable color temperature and better-defined chromaticity. Furthermore, the manufacturing method for the LED device uses the screen with different meshes to sift luminescent conversion elements inside the luminescent layer to form multiple luminescent conversion layers with different specific gravities that leads to ease of mass production in manufacturing.

It is to be understood, however, that even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A manufacturing method for an LED device, comprising the following steps:
   providing a substrate having a first electrode, a second electrode and a reflector located on top faces of the first and the second electrodes;
   disposing an LED chip located on the first electrode inside the reflector and electrically connected to the first and the second electrodes;
   providing a screen on the reflector, the screen having a first portion and a second portion with different meshes;
   forming a luminescent conversion layer inside the reflector and covering the LED chip, the luminescent conversion layer comprising a first luminescent conversion layer and a second luminescent conversion layer, wherein the first luminescent conversion layer is formed by sifting of a liquid encapsulant into the reflector through the first portion of the screen and the second luminescent conversion layer is formed by sifting of the liquid encapsulant into the reflector through the second portion of the screen; and
   removing the screen and curing the luminescent conversion layer.

2. The manufacturing method for the LED device as claimed in claim 1, wherein the reflector and the substrate are manufactured integrally as a monolithic piece and are formed by molding.

3. The manufacturing method for the LED device as claimed in claim 1, wherein the first portion of the screen corresponds to the LED chip and is surrounded by the second portion.

4. The manufacturing method for the LED device as claimed in claim 1, wherein each of the meshes of the first portion is larger than that of the second portion.

5. The manufacturing method for the LED device as claimed in claim 4, wherein the first and the second luminescent conversion layer have different specific gravities.

6. The manufacturing method for the LED device as claimed in claim 1, wherein the first portion of the screen is a circle and meets the following condition:

$$E = [2 \times (\tan \theta \cdot H) + d]$$

$$\theta = \frac{(180 - \psi)}{2}$$

wherein E is a diameter of the first portion of the screen, θ is an angle of laterally-emitting light from the LED chip, H is a depth of the first luminescent conversion layer, d is a width of the LED chip and ψ is a angle of positive light from the LED chip.

7. The manufacturing method for the LED device as claimed in claim 6, wherein the ψ is between 100~130 degrees.

8. The manufacturing method for the LED device as claimed in claim 1, wherein in the step of forming the luminescent conversion layer inside the reflector and covering the LED chip, the first luminescent conversion layer corresponds to the first portion of the screen and the second luminescent conversion layer corresponds to the second portion of the screen.

9. The manufacturing method for the LED device as claimed in claim 1, wherein the luminescent conversion layer is formed by injection molding.

* * * * *